US012765190B2

(12) United States Patent
Yeon et al.

(10) Patent No.: US 12,765,190 B2
(45) Date of Patent: Oct. 13, 2026

(54) DISPLAY DEVICE

(71) Applicant: LG Display Co., Ltd., Seoul (KR)

(72) Inventors: DeukHo Yeon, Seoul (KR); KiTae Kim, Seoul (KR); SunWook Ko, Seoul (KR)

(73) Assignee: LG Display Co., Ltd., Seoul (KR)

( * ) Notice: Subject to any disclaimer, the term of this patent is extended or adjusted under 35 U.S.C. 154(b) by 406 days.

(21) Appl. No.: 18/529,058

(22) Filed: Dec. 5, 2023

(65) Prior Publication Data

US 2024/0224631 A1 Jul. 4, 2024

(30) Foreign Application Priority Data

Dec. 30, 2022 (KR) ........................ 10-2022-0191176

(51) Int. Cl.
*H10K 59/126* (2023.01)
*H10K 59/121* (2023.01)
*H10K 59/122* (2023.01)

(52) U.S. Cl.
CPC ....... *H10K 59/126* (2023.02); *H10K 59/1213* (2023.02); *H10K 59/122* (2023.02)

(58) Field of Classification Search
CPC ............. H10K 59/125; H10K 59/1213; H10K 59/122; H10K 59/131; H10K 59/12; H10K 50/865; H10K 59/8792; H10K 59/124; H10K 59/80515
See application file for complete search history.

(56) References Cited

U.S. PATENT DOCUMENTS

2001/0015626 A1* 8/2001 Ozawa ............... H10K 59/8792 315/168
2014/0231789 A1* 8/2014 Miura .............. H10K 59/80515 257/40
2016/0020422 A1* 1/2016 Kim ................. H10K 59/80522 257/40
2016/0104420 A1 4/2016 Park et al.
2017/0162606 A1* 6/2017 Yan .................... H10D 30/6734
2018/0097047 A1* 4/2018 Jung .................... H10K 59/124
2019/0189721 A1 6/2019 Kim et al.
2020/0190575 A1* 6/2020 Tsay ..................... B01J 19/0046
2024/0251622 A1* 7/2024 Deng ................... H10K 59/126
2025/0248214 A1* 7/2025 Luo .................... H10K 59/1213

FOREIGN PATENT DOCUMENTS

JP 2013-89505 A 5/2013
KR 10-2016-0042362 A 4/2016
KR 10-2019-0073850 A 6/2019
KR 10-2022-0081128 A 6/2022

* cited by examiner

*Primary Examiner* — Galina G Yushina
(74) *Attorney, Agent, or Firm* — Fenwick & West LLP

(57) ABSTRACT

A display device includes a substrate including an active area including a plurality of pixels and a non-active area located to surround the active area; a first thin film transistor disposed on the substrate and a second thin film transistor disposed to be spaced apart from the first thin film transistor; a planarization layer covering the first thin film transistor and the second thin film transistor; a first shielding layer disposed on the planarization layer; a light emitting element including an anode disposed on the planarization layer to be spaced apart from the first shielding layer; and a second shielding layer disposed on the anode. Accordingly, reliability of the display device can be improved by increasing a light shielding area in the display device.

13 Claims, 4 Drawing Sheets

DISPLAY DEVICE

CROSS-REFERENCE TO RELATED APPLICATION

This application claims the benefit of and priority to Republic of Korea Patent Application No. 10-2022-0191176 filed on Dec. 30, 2022 in the Republic of Korea, which is hereby incorporated by reference in its entirety.

BACKGROUND

Technical Field

The present disclosure relates to a display device, and more particularly, to a display device having improved reliability by increasing a light shielding area.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display (LCD), a field emission display (FED), an electro-wetting display (EWD), an organic light emitting display (OLED), and the like.

An electroluminescent display, represented by the organic light emitting display, is a self-luminous display and can be manufactured to be light and thin since it does not require a separate light source, unlike the liquid crystal display having a separate light source. In addition, the electroluminescent display has advantages in terms of power consumption due to a low voltage driving, and is excellent in terms of a color implementation, a response speed, a viewing angle, and a contrast ratio (CR). Therefore, electroluminescent displays are expected to be used in various application fields.

SUMMARY

An aspect of the present disclosure is to provide a display device having improved reliability by increasing a light shielding area.

Objects of the present disclosure are not limited to the above-mentioned objects, and other objects, which are not mentioned above, can be clearly understood by those skilled in the art from the following descriptions.

A display device according to an exemplary embodiment of the present disclosure includes a substrate including an active area including a plurality of pixels and a non-active area located to surround the active area; a first thin film transistor disposed on the substrate and a second thin film transistor disposed to be spaced apart from the first thin film transistor; a planarization layer covering the first thin film transistor and the second thin film transistor; a first shielding layer disposed on the planarization layer; a light emitting element including an anode disposed on the planarization layer to be spaced apart from the first shielding layer; and a second shielding layer disposed on the anode.

Other detailed matters of the exemplary embodiments are included in the detailed description and the drawings.

In a display device according to an exemplary embodiment of the present disclosure, an area of a light blocking area that blocks light incident into an inside of the display device in an active area can be increased by disposing a first shielding layer and a second shielding layer in the active area.

According to an exemplary embodiment of the present disclosure, light incident into a display device is blocked by disposing a first shielding layer and a second shielding layer in an active area, so that reliability of a display device can be improved.

In addition, in a display device according to an exemplary embodiment of the present disclosure, a bank defining an emission area is formed of a black material, and the bank is disposed to entirely cover side surfaces of the anode, so that light incident into the inside of the display device from the side surface of the anode is blocked, allowing for low-power driving.

The effects according to the present disclosure are not limited to the contents exemplified above, and more various effects are included in the present specification.

DETAILED DESCRIPTION

Figure 1:
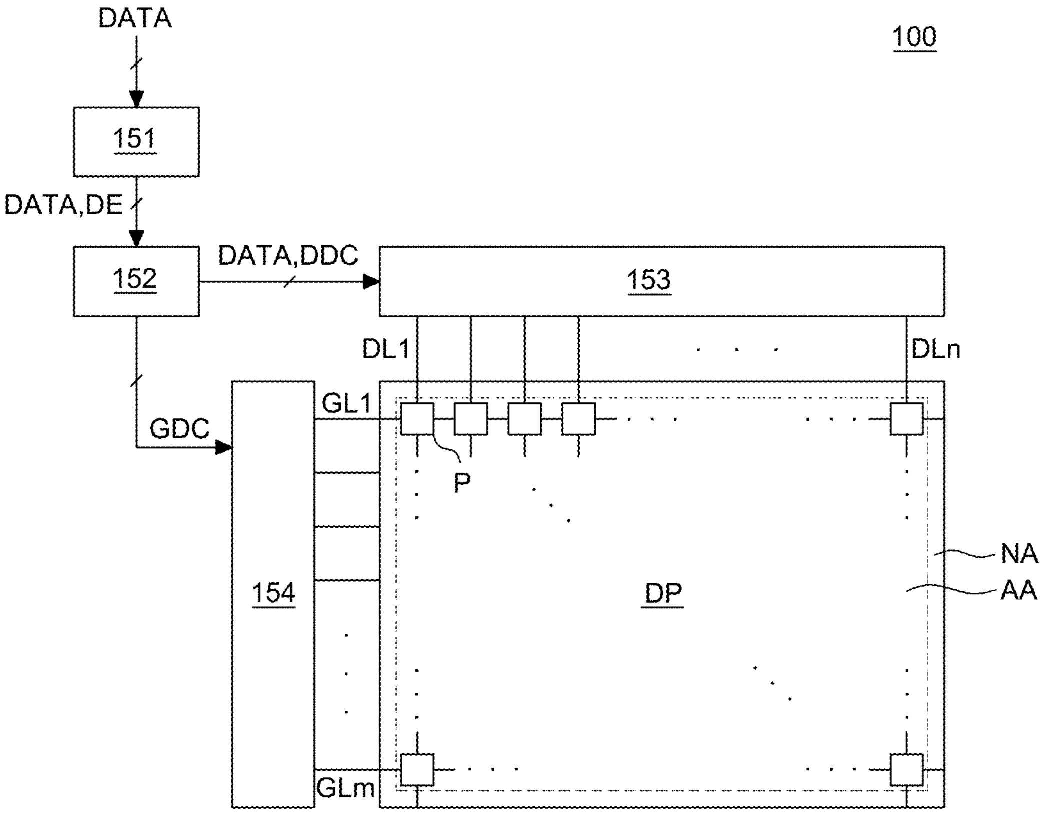
FIG. 1 is a block diagram of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

FIG. 1 is a block diagram of a display device according to an exemplary embodiment of the present disclosure.

Referring to FIG. 1, a display device 100 according to an exemplary embodiment of the present disclosure may include an image processor 151, a timing controller 152, a data driver 153, a gate driver 154, and a display panel DP.

In this case, the image processor 151 may output a data signal DATA and a data enable signal DE that are supplied from the outside. The image processor 151 may output one or more of a vertical synchronization signal, a horizontal synchronization signal, and a clock signal, in addition to the data enable signal DE.

The timing controller 152 is supplied with the data enable signal DE or the data signal DATA, together with driving signals including the vertical synchronization signal, the horizontal synchronization signal, the clock signal and the like, from the image processor 151. The timing controller 152 may output a gate timing control signal GDC for controlling an operational timing of the gate driver 154 and a data timing control signal DDC for controlling an operational timing of the data driver 153 based on the driving signals.

In addition, the data driver 153 samples and latches the data signal DATA supplied from the timing controller 152 in response to the data timing control signal DDC supplied from the timing controller 152, and converts the data signal DATA into a gamma reference voltage to output it. The data driver 153 may output the data signal DATA through data lines DL1 to DLn.

In addition, the gate driver 154 may output a gate signal while shifting a level of a gate voltage in response to the gate timing control signal GDC supplied from the timing controller 152. The gate driver 154 may output the gate signal through gate lines GL1 to GLm.

The display panel DP may display an image while sub-pixels P emit light in response to the data signal DATA and the gate signal supplied from the data driver 153 and the gate driver 154. A detailed structure of the sub-pixel P will be described in detail in FIG. 4.

The display panel DP may include an active area AA and a non-active area NA.

The active area AA is an area where an image is displayed on the display panel DP.

A plurality of the sub-pixels P and circuits for driving the plurality of sub-pixels P may be disposed in the active area AA. The plurality of sub-pixels P are minimum units constituting the active area AA, and a display element may be disposed in each of the plurality of sub-pixels P, and the plurality of sub-pixels P may constitute pixels. For example, an organic light emitting element including an anode, a light emitting layer, and a cathode may be disposed in each of the plurality of sub-pixels P, but the present disclosure is not limited thereto. In addition, the circuits for driving the plurality of sub-pixels P may include driving elements and lines. For example, the circuit may include a thin film transistor, a storage capacitor, gate lines, data lines, and the like, but is not limited thereto.

The non-active area NA is an area in which an image is not displayed.

The non-active area NA may be bent and not visible from the front or may be covered by a case (not shown), and is also referred to as a bezel area.

Although FIG. 1 illustrates that the non-active area NA surrounds the active area AA having a rectangular shape, shapes and arrangements of the active area AA and the non-active area NA are limited to an example shown in FIG. 1. That is, the active area AA and the non-active area NA may have shapes suitable for a design of an electronic device in which the flexible display device 100 is mounted. For example, the active area AA may have, for example a pentagonal shape, a hexagonal shape, a circular shape, or an elliptical shape.

In the non-active area NA, various lines and circuits for driving the organic light emitting elements of the active area AA may be disposed. For example, in the non-active area NA, driver integrated circuits (Ics) such as a gate driver IC or a data driver IC, a gate-in-panel (GIP) line, and link lines for transmitting signals to the plurality of sub-pixels and circuits of the active area AA may be disposed, but the present disclosure is not limited thereto.

The display device 100 may further include various additional elements for generating various signals or driving pixels in the active area AA. The additional elements for driving the pixels may include an inverter circuit, a multiplexer, an electro-static discharge (ESD) circuit, and the like. The display device 100 may include additional elements associated with functions other than driving of the pixels. For example, the display device 100 may further include additional elements that provide a touch sensing function, a user authentication function (e.g., fingerprint recognition), a multi-level pressure sensing function, a tactile feedback function, and the like. The aforementioned additional elements may be positioned in the non-active area NA and/or in an external circuit connected to a connection interface.

Hereinafter, a more detailed description of the circuit of the sub-pixel P of the display device 100 will be provided with reference to FIG. 2.

Figure 2:
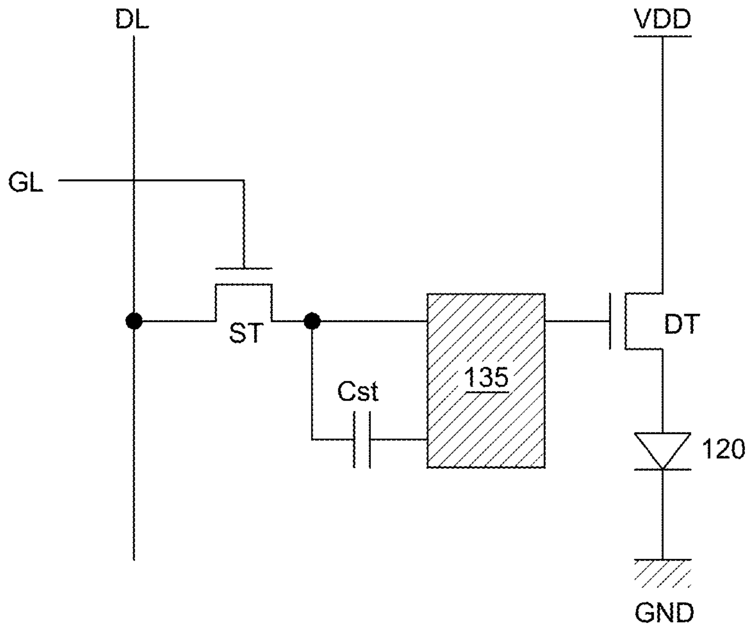
FIG. 2 is a circuit diagram of a sub-pixel of the display device according to an exemplary embodiment of the present disclosure.

FIG. 2 is a circuit diagram of a sub-pixel of the display device according to an exemplary embodiment of the present disclosure.

Referring to FIG. 2, the sub-pixel of the display device according to an exemplary embodiment of the present disclosure may include a switching transistor ST, a driving transistor DT, a compensation circuit 135, and a light emitting element 120.

The light emitting element 120 may operate to emit light according to a driving current formed by the driving transistor DT.

The switching transistor ST may perform a switching operation such that a data signal supplied through a data line DL in response to a gate signal supplied through a gate line GL is stored as a data voltage in a capacitor $C_{st}$.

The driving transistor DT may operate such that a constant driving current flows between a high potential power line VDD and a low potential power line GND in response to the data voltage stored in the capacitor $C_{st}$.

The compensation circuit 135 is a circuit configured to compensate for a threshold voltage or the like of the driving transistor DT, and the compensation circuit 135 may include one or more thin film transistors and the capacitor $C_{st}$. A configuration of the compensation circuit 135 may vary according to a compensation method.

The sub-pixel shown in FIG. 2 is configured to have a structure of 2T(Transistor)1C(Capacitor) including the switching transistor ST, the driving transistor DT, the capacitor $C_{st}$, and the light emitting element 120. However, the sub-pixel may be configured to have a variety of structures, such as 3T1C, 4T2C, 5T2C, 6T1C, 6T2C, 7T1C, 7T2C, and the like when the compensation circuit 135 is added thereto.

Hereinafter, a more detailed description of the active area AA of the display device 100 will be provided with reference to FIGS. 3 and 4.

Figure 3:
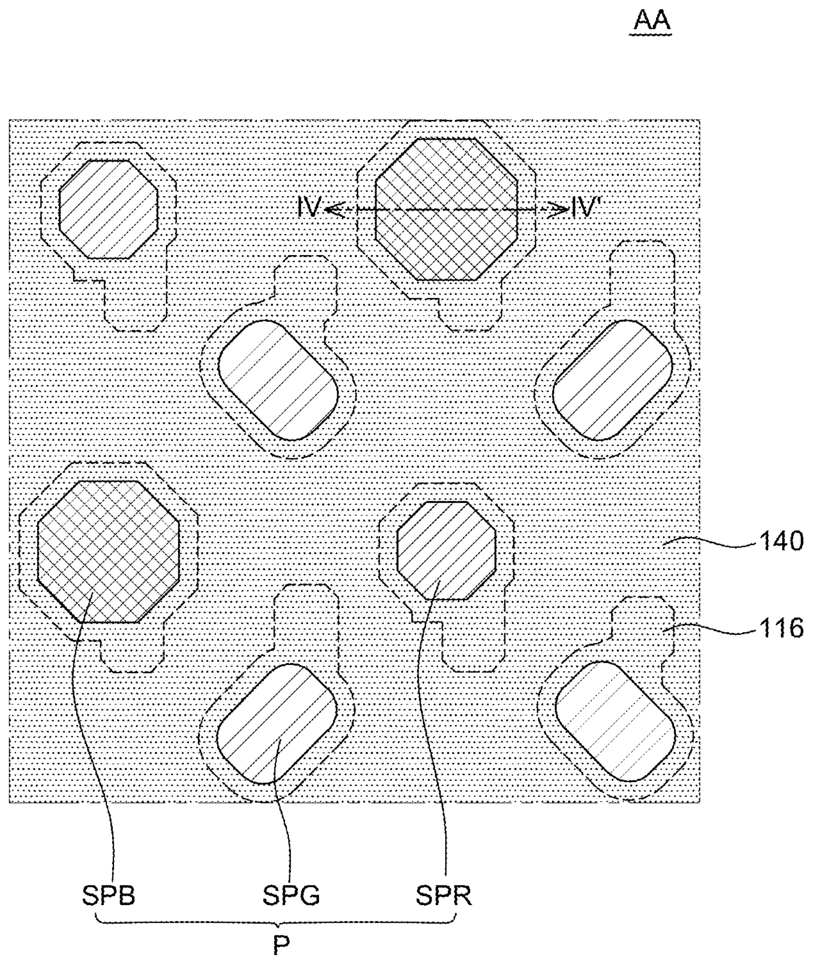
FIG. 3 is a schematic enlarged plan view illustrating an active area of the display device according to an exemplary embodiment of the present disclosure.

FIG. 3 is a schematic enlarged plan view illustrating the active area of the display device according to an exemplary embodiment of the present disclosure.

Figure 4:
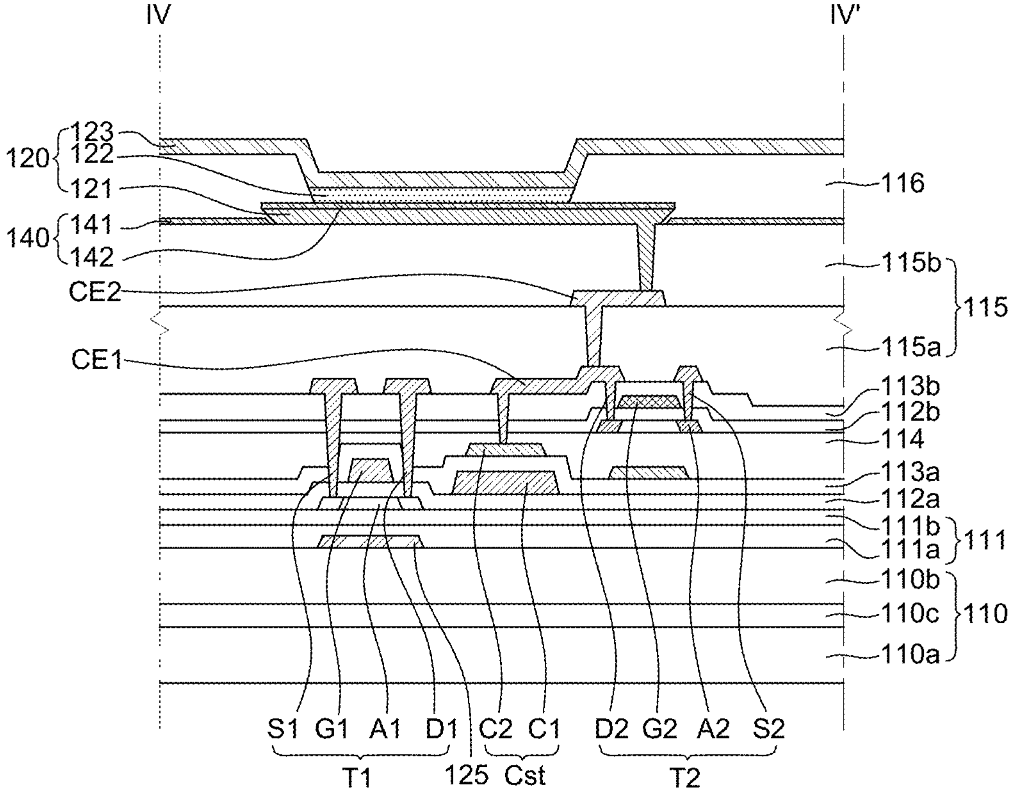
FIG. 4 is a cross-sectional view taken along IV-IV' of FIG. 3 according to an exemplary embodiment of the present disclosure.

FIG. 4 is a cross-sectional view illustrating one sub-pixel P disposed in the active area of the display device according to an exemplary embodiment of the present disclosure.

Referring to FIG. 3, the plurality of sub-pixels P are individual units that emit light, and a plurality of light emitting elements may be disposed to correspond to the plurality of sub-pixels P, respectively. That is, the plurality of light emitting elements may be disposed to correspond to the plurality of sub pixels P, respectively, and accordingly, the plurality of sub pixels P may be expressed by the plurality of light emitting elements. Each of the plurality of sub-pixels P may emit light of different wavelengths. For example, the plurality of sub-pixels P may include a red sub-pixel SPR, a green sub-pixel SPG, and a blue sub-pixel SPB.

The red sub-pixel SPR and the blue sub-pixel SPB may be alternately disposed in the same row or column. For example, the red sub-pixel SPR and the blue sub-pixel SPB may be alternately disposed in the same column, and the red sub-pixel SPR and blue sub-pixel SPB may be alternately disposed in the same row.

The green sub-pixel SPG is disposed in a column and a row that are different from those of the red sub-pixel SPR and the blue sub-pixel SPB. For example, green sub-pixels SPG may be disposed in one row, and red sub-pixels SPR and blue sub-pixels SPB may be alternately disposed in rows adjacent to the one row. In addition, green sub-pixels SPG may be disposed in one column, and a plurality of red sub-pixels SPR and blue sub-pixels SPB may be alternately disposed in columns adjacent to the one column. The red sub-pixel SPR and the green sub-pixel SPG may face each other in a diagonal direction, and the blue sub-pixel SPB and green sub-pixel SPG may also face each other in a diagonal direction. Accordingly, the plurality of sub-pixels P may be disposed in a lattice shape.

In FIG. 3, the red sub-pixel SPR and the blue sub-pixel SPB are disposed in the same column and row, and the green sub-pixel SPG is located in a column and a row that are different from those of the red sub-pixel SPR and the blue sub-pixel SPB. However, an arrangement of the plurality of sub-pixels P is not limited thereto.

In an exemplary embodiment of the present disclosure, it is described that the plurality of sub-pixels P include the red sub-pixel SPR, the green sub-pixel SPG, and the blue sub-pixel SPB, but an arrangement, the number and color combinations of the plurality of sub-pixels P may be variously changed according to design, and the present disclosure is not limited thereto.

As described above, the light emitting element is disposed in each of the plurality of sub-pixels P, and a different light emitting layer may be disposed in each of the red sub-pixel SPR, the green sub-pixel SPG, and the blue sub-pixel SPB. The same light emitting layer may be disposed in all of the plurality of sub-pixels P. For example, when different light emitting layers are disposed in the plurality of respective sub-pixels P, a red light emitting layer may be disposed in the red sub-pixel SPR, a green light emitting layer may be disposed in the green sub-pixel SPG, and a blue light emitting layer may be disposed in the blue sub-pixel SPB. For example, when the same light emitting layer is disposed in all of the plurality of sub-pixels P, light emitted from the light emitting layer may be converted into light of various colors through separate light conversion layers and a color filter.

Referring to FIG. 4, one sub-pixel P of the display device 100 according to an exemplary embodiment of the present disclosure may include a substrate 110, a first buffer layer 111, a first thin film transistor T1, a second thin film transistor T2, a first gate insulating layer 112*a*, a first interlayer insulating layer 113*a*, a second buffer layer 114, a second gate insulating layer 112*b*, a second interlayer insulating layer 113*b*, a first connection electrode CE1, a first planarization layer 115*a*, a second planarization layer 115*b*, a second connection electrode CE2, a shielding layer 140, a bank 116, an anode 121, a light emitting layer 122, and a cathode 123.

The substrate 110 may support various components of the display device 100.

The substrate 110 may be formed of glass or a plastic material having flexibility. When the substrate 110 is formed of a plastic material, it may be formed of, for example, polyimide (PI). When the substrate 110 is formed of polyimide (PI), a manufacturing process of the display device 100 is conducted in a situation where a support substrate formed of glass is disposed under the substrate 110, and after the manufacturing process of the display device 100 is completed, the support substrate may be released. Also, after the support substrate is released, a back plate for supporting the substrate 110 may be disposed under the substrate 110. However, the present disclosure is not limited thereto.

When the substrate 110 is formed of polyimide (PI), moisture permeates through the substrate 110 formed of polyimide (PI) to the first thin film transistor T1 or a light emitting structure, so that performance of the display device 100 may be degraded. The display device 100 according to an exemplary embodiment of the present disclosure may be formed of double layers of polyimide (PI) in order to prevent the performance of the display device 100 from being degraded due to moisture permeation. And, by forming an inorganic layer between two layers of polyimide (PI), it is possible to block a moisture component from passing through a lower polyimide (PI), so that product performance reliability can be improved.

In addition, in the display device 100 according to an exemplary embodiment of the present disclosure, an inorganic layer is formed between two layers of polyimide (PI), electric charges that are charged in a lower polyimide PI are blocked, so that product reliability can be improved. In addition, since a process of forming a metal layer in order to block the electric charge charged in the polyimide (PI) can be omitted, process simplification may be allowed and a production cost can be reduced.

In the display device 100 using polyimide (PI) as the substrate 110, it is very important to secure environmental reliability performance and performance reliability of the panel.

Accordingly, the display device 100 according to an exemplary embodiment of the present disclosure may implement a structure for securing environmental reliability of a product by using double layers of polyimide (PI) as a substrate. For example, the substrate 110 of the display device 100 may include a first polyimide layer 110*a* and a second polyimide layer 110*b* that are formed of polyimide (PI), and an inorganic insulating layer 110*c* formed between the first polyimide layer 110*a* and the second polyimide layer 110*b*, but the present disclosure is not limited thereto. In a case in which electric charges are charged in the first polyimide layer 110*a*, the inorganic insulating layer 110*c* may serve to prevent the electric charge from affecting the first thin film transistor T1 through the second polyimide layer 110*b*. In addition, the inorganic insulating layer 110*c* may serve to block a moisture element from passing through the second polyimide layer 110*b* and penetrating into an upper portion thereof.

The inorganic insulating layer 110*c* may be formed of a single layer of silicon nitride (SiNx) or silicon oxide (SiOx) or multiple layers thereof. In the display device 100 according to the exemplary embodiment of the present disclosure, the inorganic insulating layer 110*c* may be formed of a silicon oxide (SiOx) material. For example, the inorganic insulating layer 110*c* may be formed of a silicon dioxide material (silica or silicon dioxide: $SiO_2$). However, the present disclosure is not limited thereto, and the inorganic insulating layer 110*c* may be formed of double layers of silicon dioxide ($SiO_2$) and silicon nitride (SiNx).

The first buffer layer 111 may be disposed on the substrate 110. Specifically, a multi-buffer layer 111*a* may be disposed on the substrate 110, and an active buffer layer 111*b* may be disposed on the multi-buffer layer 111*a*.

A metal layer 125 may be disposed between the substrate 110 and the multi-buffer layer 111*a*.

Here, the metal layer 125 may serve as a light shielding component and may also be referred to as a light blocking layer.

The multi-buffer layer 111*a* may be disposed on the metal layer 125, and the active buffer layer 111*b* may be disposed on the multi-buffer layer 111*a*.

The first thin film transistor T1 may be disposed on the first buffer layer 111. The first thin film transistor T1 may include a first active layer A1, a first gate electrode G1, a first source electrode S1 and a first drain electrode D1. Here, according to a design of a pixel circuit, the first source electrode S1 may serve as a first drain electrode, and the first drain electrode D1 may serve as a first source electrode.

The first active layer A1 may include amorphous silicon or polycrystalline silicon. For example, the first active layer T1 may include low-temperature polysilicon (LTPS). For example, since a polysilicon material has low energy consumption and excellent reliability due to high mobility (100 $cm^2/Vs$ or more), it can be applied to a multiplexer (MUX) and/or a gate driver for a driving element that drives thin film transistors for display elements and can also be applied as the active layer A1 of the driving thin film transistor in the display device 100 according to an exemplary embodiment of the present disclosure. However, the present disclosure is not limited thereto. For example, it can also be applied as an active layer A2 of the switching thin film transistor according to characteristics of the display device 100. Polysilicon is formed by depositing an amorphous silicon (a-Si) material on the first buffer layer 111 and performing a dehydrogenation process and a crystallization process, and the first active layer A1 may be formed by patterning the polysilicon. Here, the first active layer A1 may include a first channel region in which a channel is formed when the first thin film transistor T1 is driven, and a first source region and a first drain region on both sides of the first channel region. The first source region means a portion of the first active layer A1 that is connected to the first source electrode S1, and the first drain region means a portion of the first active layer A1 that is connected to the first drain electrode D1. For example, the first source region and the first drain region may be configured by ion-doping (impurity doping) of the first active layer A1. The first source region and the first drain region may be formed by performing ion-doping on the polysilicon material, and the first channel region may refer to a portion that is not subjected to ion-doping and is left as the polysilicon material.

The first gate insulating layer 112*a* may be disposed on the first active layer A1. The first gate insulating layer 112*a* may be formed of a single layer of silicon nitride (SiNx) or silicon oxide (SiOx) or multiple layers thereof. Contact holes for connecting the first source electrode S1 and the first drain electrode D1 of the first thin film transistor T1 to the first source region and the first drain region of the first active layer A1 of the first thin film transistor T1, respectively, may be formed in the first gate insulating layer 112*a*.

The first gate electrode G1 of the first thin film transistor T1 and a first capacitor electrode C1 of a storage capacitor $C_{st}$ may be disposed on the first gate insulating layer 112*a*.

In this case, the first gate electrode G1 and the first capacitor electrode C1 may be formed as a single layer or multilayers composed of any one of molybdenum (Mo), copper (Cu), titanium (Ti), aluminum (Al), chromium (Cr), gold (Au), nickel (Ni), and neodymium (Nd), or an alloy of them. The first gate electrode G1 may be formed on the first gate insulating layer 112*a* to overlap the first channel region of the first active layer A1 of the first thin film transistor T1.

The first capacitor electrode C1 may be omitted based on driving characteristics of the display device 100 and a structure and type of the thin film transistor. The first gate electrode G1 and the first capacitor electrode C1 may be formed by the same process. In addition, the first gate electrode G1 and the first capacitor electrode C1 may be formed of the same material, and may be formed on the same layer.

The first interlayer insulating layer 113*a* may be disposed on the first gate insulating layer 112*a*, the first gate electrode G1, and the first capacitor electrode C1. The first interlayer insulating layer 113*a* may be formed of a single layer of silicon nitride (SiNx) or silicon oxide (SiOx) or multiple layers thereof. Contact holes for exposing the first source region and the first drain region of the first active layer A1 of the first thin film transistor T1 may be formed in the first interlayer insulating layer 113*a*.

A second capacitor electrode C2 of the storage capacitor $C_{st}$ may be disposed on the first interlayer insulating layer 113*a*. The second capacitor electrode C2 may be formed as a single layer or multilayers composed of any one of molybdenum (Mo), copper (Cu), titanium (Ti), aluminum (Al), chromium (Cr), gold (Au), nickel (Ni), and neodymium (Nd), or an alloy of them. The second capacitor electrode C2 may be formed above the first interlayer insulating layer 113*a* to overlap the first capacitor electrode C1. In addition, the second capacitor electrode C2 may be formed of the same material as the first capacitor electrode C1. The second capacitor electrode C2 may be omitted based on driving characteristics of the display device 100 and the structure and type of the thin film transistor.

The second buffer layer 114 may be disposed over the first interlayer insulating layer 113*a* and the second capacitor electrode C2. The second buffer layer 114 may be formed of a single layer of silicon nitride (SiNx) or silicon oxide (SiOx) or multiple layers thereof. In the second buffer layer 114, contact holes for exposing the first source region and the first drain region of the first active layer A1 of the first thin film transistor T1 may be formed. In addition, in the second buffer layer 114, a contact hole for exposing the second capacitor electrode C2 of the storage capacitor $C_{st}$ may be formed.

The second buffer layer 114 may be formed of multiple layers, but is not limited thereto.

A second active layer A2 of the second thin film transistor T2 may be disposed on the second buffer layer 114. Here, the second thin film transistor T2 may include the second active layer A2, the second gate insulating layer 112*b*, a second gate electrode G2, a second source electrode S2, and a second drain electrode D2. Here, according to the design of the pixel circuit, the second source electrode S2 may be a drain electrode, and the second drain electrode D2 may be a source electrode.

In addition, the second active layer A2 may include a second channel region in which a channel is formed when the second thin film transistor T2 is driven, and a second source region and a second drain region on both sides of the second channel region. The second source region may mean a portion of the second active layer A2 that is connected to the second source electrode S2, and the second drain region may mean a portion of the second active layer A2 that is connected to the second drain electrode D2.

The second active layer A2 may be formed of an oxide semiconductor. Since an oxide semiconductor material has a larger bandgap compared to a silicon material, electrons do not cross the bandgap in an off-state, and thus, an off-current is low. Accordingly, a thin film transistor including an active layer formed of an oxide semiconductor may be suitable for a switching thin film transistor having a short on time and a long off time, but the present disclosure is not limited thereto. Depending on characteristics of the display device 100, it may be applied as a driving thin film transistor. In addition, since the off-current is low, a size of auxiliary capacity may be reduced, the thin film transistor is suitable for a high-resolution display element. For example, the second active layer A2 may be formed of a metal oxide, for example, may be formed of various metal oxides such as indium-gallium-zinc-oxide (IGZO) and the like. Descriptions are made assuming that the second active layer A2 of the second thin film transistor T2 is formed of IGZO among various metal oxides, but the present disclosure is not limited thereto. The second active layer A2 of the second thin film transistor T2 may be formed of another metal oxide such as IZO (indium-zinc-oxide), IGTO (indium-gallium-tin-oxide), or IGO (indium-gallium-oxide) other than IGZO.

The second active layer A2 may be formed by depositing a metal oxide on the second buffer layer 114, performing a heat treatment process thereon for stabilization, and then, patterning the metal oxide.

The second gate insulating layer 112*b* may be disposed on an entirety of the substrate 110 including the second active layer A2. For example, the second gate insulating layer 112*b* may be formed of a single layer of silicon nitride (SiNx) or silicon oxide (SiOx) or multiple layers thereof.

The second gate electrode G2 may be disposed on the second gate insulating layer 112*b*.

The second gate electrode G2 may be formed as a single layer or multilayers composed of any one of molybdenum (Mo), copper (Cu), titanium (Ti), aluminum (Al), chromium (Cr), gold (Au), nickel (Ni), and neodymium (Nd), or an alloy of them.

For example, the second gate electrode G2 is formed by forming a metal material on the second gate insulating layer 112*b*, forming a photoresist pattern on the metal material, and then wet-etching the metal material using the photoresist pattern as a mask. As a wet etchant for etching metal materials, materials that selectively etch molybdenum (Mo), copper (Cu), titanium (Ti), aluminum (Al), chromium (Cr), gold (Au), nickel (Ni), and neodymium (Nd) constituting the metal materials or alloys of them, and do not etch an insulating material may be used.

The second interlayer insulating layer 113*b* may be disposed on the second gate insulating layer 112*b* and the second gate electrode G2. Contact holes for exposing the first active layer A1 of the first thin film transistor T1 and the second active layer A2 of the second thin film transistor T2 may be formed in the second interlayer insulating layer 113*b*. For example, the second interlayer insulating layer 113*b* may be provided with contact holes exposing the first source region and the first drain region of the first active layer A1 in the first thin film transistor T. The second interlayer insulating layer 113*b* may be provided with contact holes exposing the second source region and the second drain region of the second active layer A2 in the second thin film transistor T2.

The second interlayer insulating layer 113*b* may be formed of a single layer of silicon nitride (SiNx) or silicon oxide (SiOx) or multiple layers thereof.

The first connection electrode CE1, the first source electrode S1 and the first drain electrode D1 of the first thin film transistor T1, and the second source electrode S2 and the second drain electrode D2 of the second thin film transistor T2 may be disposed on the second interlayer insulating layer 113*b*.

The first connection electrode CE1 may be electrically connected to the second drain electrode D2 of the second thin film transistor T2. Also, the first connection electrode CE1 may be electrically connected to the second capacitor electrode C2 of the storage capacitor $C_{st}$ through contact holes formed in the second buffer layer 114 and the second interlayer insulating layer 113*b*. That is, the first connection electrode CE1 may serve to electrically connect the second capacitor electrode C2 of the storage capacitor $C_{st}$ and the second drain electrode D2 of the second thin film transistor T2.

Here, the first source electrode S1 and the first drain electrode D1 of the first thin film transistor T1 may be connected to the first active layer A1 of the first thin film transistor T1 through contact holes formed in the first gate insulating layer 112*a*, the first interlayer insulating layer 113*a*, the second buffer layer 114, and the second interlayer insulating layer 113*b*.

The second source electrode S2 and the second drain electrode D2 of the second thin film transistor T2 may be connected to the second active layer A2 through contact holes formed in the second interlayer insulating layer 112*b*.

The first connection electrode CE1, the first source electrode S1 and the first drain electrode D1 of the first thin film transistor T1, and the second source electrode S2 and the second drain electrode D2 of the second thin film transistor T2 may be formed of the same material through the same process.

For example, the first connection electrode CE1, the first source electrode S1 and the first drain electrode D1 of the first thin film transistor T1, and the second source electrode S2 and the second drain electrode D2 of the second thin film transistor T2 may be formed as single layers or multilayers composed of any one of molybdenum (Mo), copper (Cu), titanium (Ti), aluminum (Al), chromium (Cr), gold (Au), nickel (Ni), and neodymium (Nd), or an alloy of them. For example, the first connection electrode CE1, the first source electrode S1 and the first drain electrode D1 of the first thin film transistor T1, and the second source electrode S2 and the second drain electrode D2 of the second thin film transistor T2 may have a three-layer structure of titanium (Ti)/aluminum (Al)/titanium (Ti), but the present disclosure is not limited thereto.

The first connection electrode CE1 may be integrally formed with and connected to the second drain electrode D2 of the second thin film transistor T2, but the present disclosure is not limited thereto.

The first planarization layer 115*a* may be disposed over the first connection electrode CE1, the first source electrode S1 and the first drain electrode D1 of the first thin film transistor T1, the second source electrode S2 and the second drain electrode D2 of the second thin film transistor T2, and the second interlayer insulating layer 113*b*.

The first planarization layer 115*a* may be an organic layer for planarizing and protecting upper portions of the first thin film transistor T1 and the second thin film transistor T2. For example, the first planarization layer 115*a* may be formed of an organic material such as acrylic resin, epoxy resin, phenolic resin, polyamide resin, polyimide resin, and the like.

The second connection electrode CE2 may be disposed on the first planarization layer 115*a*. The second connection electrode CE2 may be connected to the second drain electrode D2 of the second thin film transistor T2 through a contact hole of the first planarization layer 115*a*. The second connection electrode CE2 may serve to electrically connect the second thin film transistor T2 and the first electrode 121. In addition, the second connection electrode CE2 may be formed as a single layer or multilayers composed of any one of molybdenum (Mo), copper (Cu), titanium (Ti), aluminum (Al), chromium (Cr), gold (Au), nickel (Ni), and neodymium (Nd), or an alloy of them. The second connection electrode CE2 may be formed of the same material as the second source electrode S2 and the second drain electrode D2 of the second thin film transistor T2.

The second planarization layer 115*b* may be disposed over the second connection electrode CE2 and the first planarization layer 115*a*. For example, the second planarization layer 115*b* may be formed of an organic material such as acrylic resin, epoxy resin, phenolic resin, polyamide resin, polyimide resin, and the like.

The light emitting element 120 including the anode 121, the light emitting layer 122, and a cathode 122 may be disposed on the second planarization layer 115*b*.

The anode 121 may be disposed on the second planarization layer 115*b*. In this case, the anode 121 may be electrically connected to the second connection electrode CE2 through a contact hole provided in the second planarization layer 115*b*. The anode 121 may be formed of a metallic material.

According to an exemplary embodiment of the present disclosure, when the display device 100 is configured to include the second thin film transistor T2 formed of an oxide semiconductor, the display device 100 is vulnerable to light incident therein.

For example, when light is incident into the inside of the display device, a value of a threshold voltage Vth at which a thin film transistor formed of an oxide semiconductor is turned on may be varied. When the value of the threshold voltage Vth of the thin film transistor formed of an oxide semiconductor is varied during driving of the display device, there is a defect in which screen abnormality occurs in the display device.

Accordingly, according to an exemplary embodiment of the present disclosure, reliability of the display device 100 may be improved by blocking light incident into the inside of the display device 100.

Conventionally, banks defining emission areas on the anodes are formed of a black material to block light incident into the inside of the display device. However, in this case, the light incident into the inside of the display device is blocked by the banks in regions covering end portions of the anodes, and the light is incident in other regions where the banks are not disposed and is incident on thin film transistors formed of oxide semiconductors, so there is a defect in which screen abnormality of the display device occurs. In addition, there is a defect in which even in regions where the banks are disposed, some wavelengths of light pass through the banks formed of black material and flow into the thin film transistors formed of oxide semiconductors, resulting in screen abnormality of the display device.

Accordingly, according to an exemplary embodiment of the present disclosure, by disposing the shielding layer 140 on the display device 100 such that an area of the shielding layer 140 is approximately 99% of a total area of the active area AA, the light incident into the inside of the display device 100 is blocked, so that reliability of the display device 100 may be improved.

Specifically, according to an exemplary embodiment of the present disclosure, the shielding layer 140 may be disposed on the second planarization layer 115*b* on which the anode 121 is disposed in the active area AA.

In this case, when the display device 100 is a top emission type in which light emitted from the light emitting element 120 is emitted upwardly of a substrate above which the light emitting element 120 is disposed, the anode 121 may further include a transparent conductive layer and a reflective layer on the transparent conductive layer. The transparent conductive layer may be formed of, for example, a transparent conductive oxide such as ITO or IZO, and the reflective layer may be formed of, for example, silver (Ag), aluminum (Al), gold (Au), molybdenum (Mo), tungsten (W), chromium (Cr), or alloys thereof.

When the anode 121 includes a reflective layer, the reflective layer may block a portion of light that is incident on the anode 121 in front, but may not block light incident in the region where the anode 121 is not disposed. Also, even if the reflective layer is present, some wavelengths of light may be transmitted therethrough.

Therefore, according to an exemplary embodiment of the present disclosure, by disposing the shielding layer 140 on the anode 121 and on the second planarization layer 115*b* exposed by the anode 121, light incident into the inside of the display device 100 may be blocked by both the region where the anode 121 is disposed and the region where the anode 121 is not disposed.

The anode 121 according to an exemplary embodiment of the present disclosure may have a reverse tapered shape. The anode 121 is disposed to have a reverse tapered shape in which a width of a cross-section of an upper portion is greater than a width of a cross-section of a lower portion. However, the shape of the anode 121 is not limited to reverse tapered shape, but may also be other shape as long as a width of the upper surface of the anode 121 is greater than a width of lower surface of the anode 121.

For example, the anode 121 having a reverse tapered shape may be formed by depositing the anode 121 on the second planarization layer 115*b* and wet-etching the anode 121.

Thereafter, the shielding layer 140 may be formed on the second planarization layer 115*b* on which the anode 121 having a reverse tapered shape is disposed.

In the display device 100 according to an exemplary embodiment of the present disclosure, the shielding layer 140 may be formed of a single metal layer to cover both the active area AA and the non-active area NA. For example, the metal layer may be formed of a metal having a work function of 4.3 or less, but is not limited thereto. For example, when the shielding layer 140 is formed of a metal having a work function of 4.3 or less, flows of electrons and holes between the light emitting elements 120 including the anode 121, the light emitting layer 122, and the cathode 123 may be smoothly made.

Specifically, according to an exemplary embodiment of the present disclosure, when depositing one metal layer for forming the shielding layer 140 on the second planarization layer 115*b* on which the anode 121 having a reverse tapered shape is disposed, the one metal layer is disconnected due to a reverse tapered structure of the anode 121. That is, the metal layer is formed on upper surfaces of the anode 121 and the second planarization layer 115*b*, but is not formed on side surfaces of the anode 121. Accordingly, the metal layer disposed on the second planarization layer 115*b* constitutes a first shielding layer 141, and the metal layer disposed on the anode 121 constitutes a second shielding layer 142. In this case, the first shielding layer 141 may be disposed on the second planarization layer 115*b* and at least partially overlaps with an upper portion of the anode 121.

Accordingly, the shielding layer 140 may be disposed over an entire area of the active area AA in a plan view. Accordingly, the area of the shielding layer 140 that blocks light may be increased in the active area AA without an additional mask.

Accordingly, according to an exemplary embodiment of the present disclosure, even when light is introduced into the display device 100, the light is blocked by the first shielding layer 141 and the second shielding layer 142, so that the light cannot be introduced into the first thin film transistor T1 or the second thin film transistor T2. According to an embodiment of the present disclosure, in a plan view, the first shielding layer 141 overlaps with the second shielding layer 142 in an edge area of the anode 121.

According to an exemplary embodiment of the present disclosure, the first shielding layer 141 and the second shielding layer 142 may be formed of the same material as they are formed using one metal layer. For example, each of the first shielding layer 141 and the second shielding layer 142 may be formed of any one of Ag, Au, Cu, Mo, Ni, Pd, Te, W, and Ta, or an alloy thereof, but the present disclosure is not limited thereto.

Meanwhile, according to an exemplary embodiment of the present disclosure, the bank 116 may be disposed to cover an end portion of the anode 121. Specifically, the bank 116 may be disposed to cover a portion of the first shielding layer 141 and a portion of the second shielding layer 142.

For example, the bank 116 may be formed of a black material. The bank 116 may be formed by dispersing black dye in an organic material, but may also be formed of any material as long as the material exhibits a black color. For example, the organic material may be a polymer including a cardo-based polymer and epoxy acrylate, but the present disclosure is not limited thereto. As the bank 116 is formed of a black material, the side surfaces of the anode 121 at which the first shielding layer 141 and the second shielding layer 142 are separated are not exposed. Accordingly, when light is incident into the inside of the display device 100, the light is blocked by the first shielding layer 141, the second shielding layer 142, and the bank 116, so that the light is not introduced into the first thin film transistor T1 or the second thin film transistor T2.

Meanwhile, the light emitting layer 122 may be disposed in an open area of the bank 116. Accordingly, the light emitting layer 122 may be disposed on the anode 121 that is exposed through the open area of the bank 116.

The cathode 123 may be disposed on the light emitting layer 122.

The light emitting element 120 may be formed by the anode 121, the light emitting layer 122 and the cathode 123. The light emitting layer 122 may include a plurality of organic layers.

Although not shown, an encapsulation layer for preventing the first thin film transistor T1, the second thin film transistor T2, and the light emitting element 120, which are components of the display device 100, from being oxidized or damaged due to moisture, oxygen, or impurities introduced from the outside may be further disposed on the light emitting element 120.

When the display device 100 further includes an encapsulation layer, the encapsulation layer may have a single-layer structure or a multilayer structure. For example, the encapsulation layer may be formed of an inorganic layer or an organic layer, or may have a multilayer structure in which the inorganic layer and the organic layer are alternately formed.

For example, the inorganic layer may be disposed on entire upper surfaces of the first thin film transistor T1, the second thin film transistor T2, and the light emitting element 120, and may be formed of one of silicon nitride (SiNx) or aluminum oxide (AlyOz), which is an inorganic material, but the present disclosure is not limited thereto. An inorganic encapsulation layer may be further disposed on an organic encapsulation layer disposed on the inorganic encapsulation layer.

The organic encapsulation layer is disposed on the inorganic encapsulation layer, and may be formed of silicon oxycarbon (SiOCz) (which is an organic material), acryl, or epoxy-based resin, but the present disclosure is not limited thereto. When a defect occurs due to a crack generated by a foreign substance or particle that may occur during the process, bends and the foreign substance may be compensated while being covered by the organic encapsulation layer. Accordingly, the organic encapsulation layer may be referred to as a foreign material compensation layer.

Although not shown, the display device 100 may further include a polarization layer on the encapsulation layer.

The polarization layer suppresses reflection of external light on the active area AA of the substrate 110. When the display device 100 is used outside, external natural light is introduced and reflected by the reflective layer included in the anode 121 of the light emitting element 120 or by an electrode formed of a metal disposed below the light emitting element 120. An image of the display device 100 may not be visible due to the reflected light described above. The polarization layer polarizes the light introduced from the outside in a specific direction and prevents the reflected light from being emitted to the outside of the display device 100 again.

In addition, a touch panel may be further disposed on the polarization layer. However, the present disclosure is not limited thereto, and a touch panel may be disposed on the encapsulation layer, and a polarizing film may be disposed on the touch panel.

The touch panel is in an input method in which a user can directly input information on a screen by pressing a display screen with a hand or a pen. For example, the touch panel is evaluated as the most ideal input method in a GUI (Graphical User Interface) environment because a user can directly perform a desired operation while looking at the screen, and anyone can easily operate it. The touch panel is widely used in various fields of application, such as mobiles, PDAs banks or government offices, various types of medical equipment, and guidance of tourism and major institutions.

The exemplary embodiments of the present disclosure can also be described as follows:

According to an aspect of the present disclosure, a display device, comprising a substrate including an active area including a plurality of pixels and a non-active area located to surround the active area, a first thin film transistor disposed on the substrate and a second thin film transistor disposed to be spaced apart from the first thin film transistor, a planarization layer covering the first thin film transistor and the second thin film transistor, a first shielding layer disposed on the planarization layer, a light emitting element including an anode disposed on the planarization layer to be spaced apart from the first shielding layer, and a second shielding layer disposed on the anode.

The anode may have a reverse tapered shape.

A width of a cross-section of an upper portion of the anode is greater than a width of a cross-section of a lower portion of the anode, and the first shielding layer is disposed to at least partially overlap an upper end surface of the anode, and may be disposed to be spaced apart from a lower end surface of the anode.

The first shielding layer and the second shielding layer may be formed of the same material.

The first shielding layer and the second shielding layer may be respectively formed of any one of Ag, Au, Cu, Mo, Ni, Pd, Te, W, and Ta, or an alloy thereof.

The display device may further comprise a bank disposed on the planarization layer to cover an end portion of the anode, the bank may cover a portion of the first shielding layer and a portion of the second shielding layer.

The bank may be formed of a black material.

The first thin film transistor may include a first active layer, a first gate electrode, a first source electrode, and a first drain electrode, and the second thin film transistor may include a second active layer, a second gate electrode, a second source electrode, and a second drain electrode.

The display device may further comprise at least one insulating layer disposed on the first gate electrode of the first thin film transistor, the second thin film transistor may be disposed on the insulating layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:

a substrate including an active area including a plurality of pixels and a non-active area that surrounds the active area;

a first thin film transistor on the substrate and a second thin film transistor that is spaced apart from the first thin film transistor;

a planarization layer covering the first thin film transistor and the second thin film transistor;

a first shielding layer on the planarization layer;

a light emitting element including an anode on the planarization layer and spaced apart from the first shielding layer; and a second shielding layer on the anode, wherein a width of an upper portion of the anode is greater than a width of a lower portion of the anode, wherein the first shielding layer at least partially overlaps with the upper portion of the anode, and is spaced apart from the lower portion of the anode.

2. The display device of claim 1, wherein the anode has a reverse tapered shape.

3. The display device of claim 2, wherein the first shielding layer and the second shielding layer comprise a same material.

4. The display device of claim 3, wherein the first shielding layer and the second shielding layer respectively include any one of silver, gold, copper, molybdenum, nickel, palladium, tellurium, tungsten, and tantalum, or an alloy thereof.

5. The display device of claim 1, further comprising:

a bank on the planarization layer, the bank covering an end portion of the anode, wherein the bank covers a portion of the first shielding layer and a portion of the second shielding layer.

6. The display device of claim 5, wherein the bank comprises a black material.

7. The display device of claim 1, wherein the first thin film transistor includes a first active layer, a first gate electrode, a first source electrode, and a first drain electrode, and the second thin film transistor includes a second active layer, a second gate electrode, a second source electrode, and a second drain electrode.

8. The display device of claim 7, further comprising:

at least one insulating layer on the first gate electrode of the first thin film transistor, wherein the second thin film transistor is on the at least one insulating layer.

9. A display device comprising:

a substrate including an active area including a plurality of pixels and a non-active area that surrounds the active area;

a thin film transistor on the substrate;

a planarization layer covering the thin film transistor;
a first shielding layer on the planarization layer;
a light emitting element including an anode on the planarization layer; and
a second shielding layer on an upper portion of the anode,
wherein a width of the upper portion of the anode is greater than a width of a lower portion of the anode, and
wherein the first shielding layer at least partially overlaps with the upper portion of the anode, and is spaced apart from the lower portion of the anode.

10. The display device of claim 9, wherein, in a plan view of the display device, the first shielding layer overlaps with the second shielding layer in an edge area of the anode.

11. The display device of claim 9, wherein the first shielding layer and the second shielding layer respectively include any one of silver, gold, copper, molybdenum, nickel, palladium, tellurium, tungsten, and tantalum, or an alloy thereof.

12. The display device of claim 9, further comprising:
a bank on the planarization layer, the bank covering an end portion of the anode,
wherein the bank covers a portion of the first shielding layer and a portion of the second shielding layer.

13. The display device of claim 12, wherein the bank comprises a black material.

* * * * *